United States Patent [19]

Wright

[11] Patent Number: 5,051,644
[45] Date of Patent: Sep. 24, 1991

[54] ELECTRODE STRUCTURE WITH CONSTANT VELOCITY AND PREDETERMINED REFLECTIVITY

[75] Inventor: Peter Wright, Dallas, Tex.

[73] Assignee: R. F. Monolithics, Inc., Dallas, Tex.

[21] Appl. No.: 510,964

[22] Filed: Apr. 19, 1990

[51] Int. Cl.$^5$ ............................................. H01L 41/08
[52] U.S. Cl. ........................... 310/313 B; 310/313 D; 333/154
[58] Field of Search ........... 310/313 R, 313 B, 313 D; 333/150, 151, 153, 154, 193–195

[56] References Cited

U.S. PATENT DOCUMENTS

| | | | |
|---|---|---|---|
| 4,162,465 | 7/1979 | Hunsinger et al. | 310/313 B X |
| 4,616,197 | 10/1986 | Wright | 333/194 |
| 4,635,009 | 1/1987 | Ebata | 310/313 D X |
| 4,731,595 | 3/1988 | Wright | 333/195 |
| 4,890,369 | 1/1990 | Tanski | 310/313 B X |
| 4,965,479 | 10/1990 | Elliott | 310/313 D |

Primary Examiner—Mark O. Budd
Attorney, Agent, or Firm—Jones, Day, Reavis & Pogue

[57] ABSTRACT

An electrode structure for use with a surface acoustic wave resonator which has the same velocity as the transducers and gratings but no reflections; a second embodiment provides an electrode structure having a velocity equal to the velocity of the transducers and gratings but that has a coefficient of reflectivity that can be predetermined by varying the width of the electrodes in the electrode structure.

24 Claims, 2 Drawing Sheets

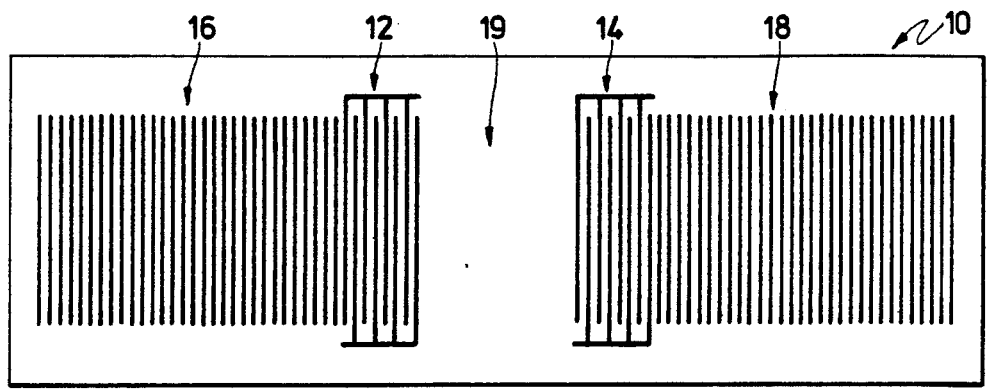
FIG.1 (PRIOR ART)
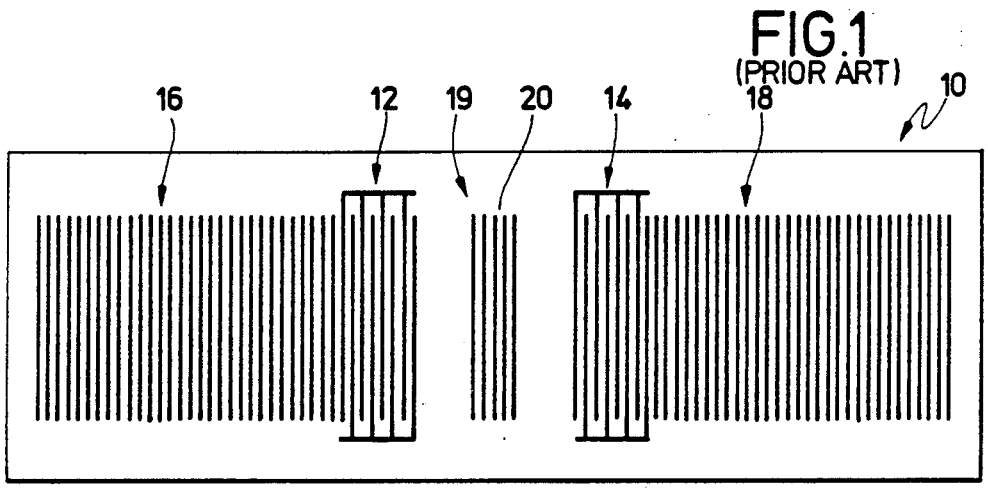
FIG.2 (PRIOR ART)
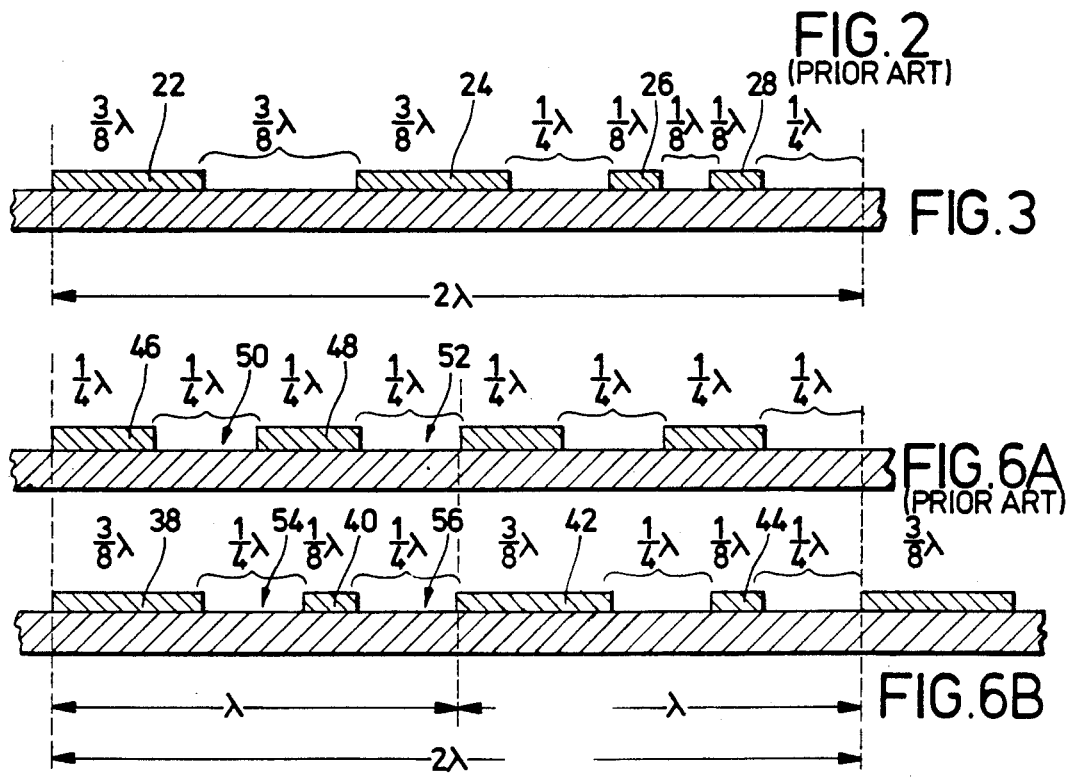

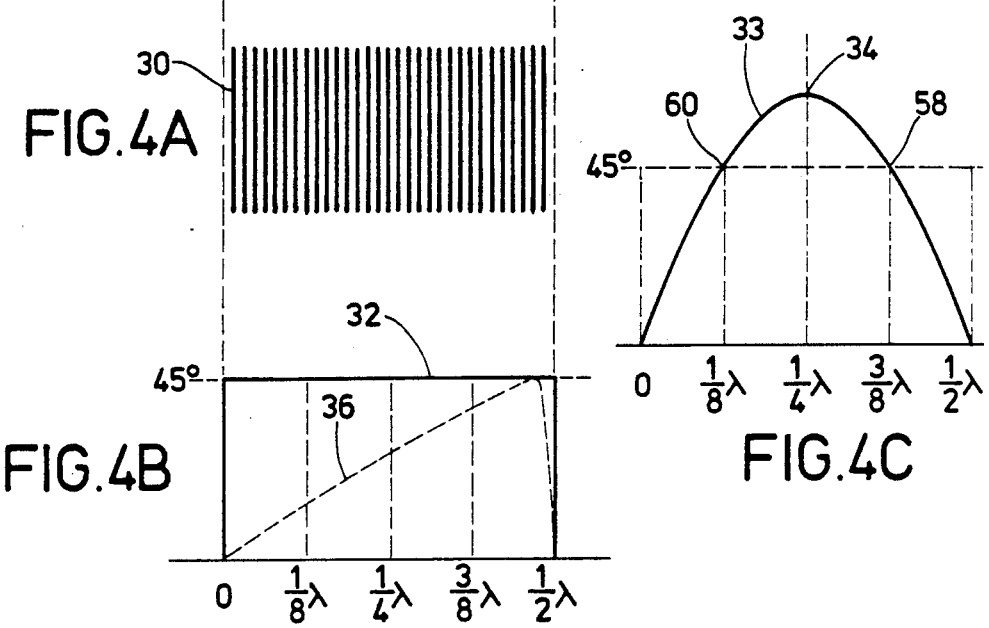
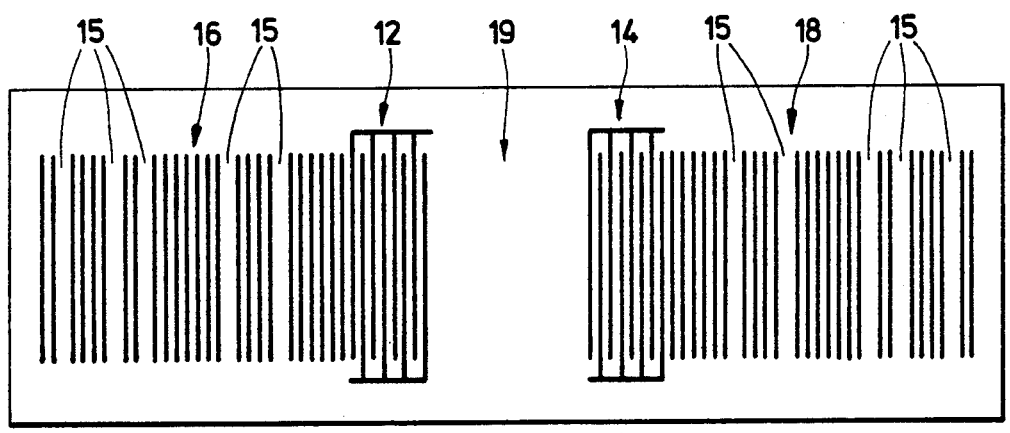
FIG.5
(PRIOR ART)

ELECTRODE STRUCTURE WITH CONSTANT VELOCITY AND PREDETERMINED REFLECTIVITY

BACKGROUND OF THE INVENTION

It is well known in the surface acoustic wave art that resonators pose a particular problem in their construction. Resonators require a constant velocity throughout their structure and typically include first and second reflective gratings with first and second spaced transducers inserted between the gratings. If the transducers are very close to each other, electromagnetic cross-talk occurs because the transducers are very capacitive. Thus, they must be separated or isolated from each other electrically. When they are separated, an unmetallized region occurs between the two transducers. That region does not have the same velocity as the metallized regions, those having the transducer electrodes or the reflective gratings thereon. This means that the unmetallized region or cavity is no longer resonant at the same frequency as the gratings or the transducer. Therefore, the cavity must be changed in length to perturb the frequency. This is a very complicated process but must be accomplished since the cavity, without electrodes, causes an insertion loss and distortion of the phase response of the resonator.

Thus, a center grating must be added to cause a constant velocity through the region separating the two transducers. Further, it is important that the center gratings do not cause reflections. If $\lambda/4$ electrodes are used as the coupling grating, the velocity of the acoustic waves through the cavity is constant, but reflections occur from the center grating electrodes. Split-finger electrodes, well known in the art, could be used as a center grating and no reflections would occur, but then the velocity through the region would be different because there are a different number of edges per given length. Thus, with $\lambda/4$ electrodes, there are four edges for the two electrodes and a 50/50 metallization or 50% of the region is metallized and 50% is free space. If split-finger electrodes are used, there is still a 50/50 metallization to free space ratio, but there are now eight reflector edges instead of two. The velocity of the acoustic wave is affected by energy stored at the electrode edges and the split-finger electrode has twice as many edges. Thus, the velocity through the split-finger electrodes is different than the velocity through a structure having $\lambda/4$ electrodes.

Further, it is also known in such resonators that the resonators are most generally constructed with uniformly distributed reflectors. For example, all electrodes may be $\lambda/4$ in width and separated by $\lambda/4$ free space regions. The reflection characteristic of a uniform reflector has relatively strong side lobes and a large insertion loss. In order to reduce these disadvantages, withdrawal weighted reflector gratings are used. Withdrawal weighting is the selective omission, or withdrawing, of reflective elements or electrodes. Proper withdrawal weighting causes reduced reflection side lobes. However, as soon as some of the electrode fingers or elements are removed, the velocity is changed through the grating, thus creating distortion and insertion loss. In order to compensate for these disadvantages in the prior art, the remaining electrodes have to be shifted or moved to a different position on the substrate to compensate for the missing electrodes. But in order to determine where the electrodes must be positioned, one has to know the acoustic velocity on the free area compared to what it is on the metallized surface and the calculations become very complicated and precise placement of the electrodes is almost impossible. Further, the electrodes are no longer on equally-spaced grids because they vary in position nonlinearly and thus it is impossible to make such a mask with an E-beam. E-beam systems are well known in the art and basically include an electron beam to write the desired pattern on a photoresist. The E-beam operates digitally on a grid system. Further, with each different type of metal that is used or with a change in metal thickness, new calculations have to be performed because of the different velocities relating to the different metals or different thicknesses and thus a separate mask must be designed for each different type of metal or metal thickness used.

The present invention overcomes the disadvantages of the prior art by disclosing a method and apparatus for forming an electrode structure for use in the transducers and reflective gratings in a surface acoustic wave device and which has constant velocity and either no reflectivity or reflectivity that can be set to any desired value during construction of the surface acoustic wave device. In this application, the term "variable reflectivity" will be used to denote such desired value of reflectivity.

To construct such a surface acoustic wave structure having no reflections and constant velocity, multiple electrodes are placed on a piezo-electric substrate with only four spaced electrodes for each $2\lambda$ distance of structure. The first two electrodes have a center-to-center spacing of $3\lambda/4$ to cause wave cancellation between the first two electrodes and the second two electrodes have a center-to-center spacing of $\lambda/4$ to cause wave cancellation between the second two electrodes, thereby creating an electrode structure with constant velocity and no reflectivity. The structure has constant velocity because, over the entire electrode structure, only two electrodes per $\lambda$ are used. Thus, it is acoustically equivalent to a uniform $\lambda/4$ structure. It has a metal-to-free-space ratio of 50/50 and it has the same number of electrode edges as a structure having two electrodes per wavelength. Thus, the velocity through the structure is constant. It has no reflections because the first two electrodes of each $2\lambda$ distance of structure are $3\lambda/8$ in width and are separated by $3\lambda/8$ space. Thus, the round trip distance from the center of one electrode to the other is $12\lambda/8$ or $6\lambda/4$ or one and one-half wavelengths. Since this is an odd multiple, the reflected wave is out of phase with the transmitted wave and cancels it. In like manner, the center-to-center spacing distance of the second two electrodes in each $2\lambda$ distance of structure is $\lambda/4$ or one-fourth wavelength. Thus, the round trip distance is $\lambda/2$ or one-half wavelength and causes the reflected wave to be out of phase with the transmitted wave and the two waves cancel. Therefore, this structure has the equivalent velocity performance of a two electrode per wavelength structure, but it has no reflectivity as does the two electrode per wavelength structure. The construction of this structure can be used in either gratings or transducers to cause nonreflective gratings or nonreflective transducers but both of which have constant velocity throughout the structure. The two $\lambda/4$ spaces are not critical and the two $\lambda/8$ electrodes can be moved in unison somewhat to the right or left without changing the results.

Where it is desirable to have a transducer or grating with variable reflectivity, such as the case with external gratings where it is desired to have a tapered reflectivity to reduce side lobes and insertion loss, the structure is arranged to have two electrodes per wavelength as is the case in a structure having quarter wavelength electrodes except in this case the first electrode is $3\lambda/8$ in width and the second electrode is $\lambda/8$ in width with separations of $\lambda/4$ between electrodes. The width of the two electrodes can be varied simultaneously during construction to vary reflectivity. Thus, the first electrode width may be varied from $\frac{3}{8}\lambda$ to $\lambda/4$ and the second electrode width may be inversely varied from $\lambda/8$ to $\lambda/4$. It is well known that for a given distance of electrode structure, the reflectivity, utilizing quarter wavelength electrodes and spaces, approximates a sine wave. Thus, with quarter wavelength electrodes, the sine of 9° equals one and the reflectivity is a maximum. However, on either side of $\lambda/4$, the reflectivity decreases. Thus, by making the first electrode have a width of $\frac{3}{8}\lambda$, the reflectivity is reduced to 0.707 ($\sqrt{2}/2$, where the angle equals 135° (45°)). In like manner, with the second electrode having a width of $\lambda/8$ (45°), the reflectivity is reduced again to 0.707 ($\sqrt{2}/2$). Thus, if the first electrode is varied in width between $\frac{3}{8}\lambda$ and $\lambda/4$ while at the same time the second electrode is inversely varied in width between $\lambda/8$ to $\lambda/4$, the entire reflectivity of a given length of electrodes is reduced anywhere between a maximum and 0.707 of the maximum. Thus, an electrode structure having the desired reflectivity can be constructed.

By combining the nonreflective structure and the variable reflective structure, greater control over the amount of reflectivity of a transducer or grating structure can be controlled to obtain any desired tapering of the reflectivity.

SUMMARY OF THE INVENTION

Thus, the present invention relates to an electrode structure for use in transducers and reflective gratings in a surface acoustic wave device, the structure having no reflections and constant velocity and comprising a piezo-electric substrate, only four spaced electrodes on the substrate for each $2\lambda$ distance of electrode structure, the first two electrodes having a center-to-center spacing of $3\lambda/4$ to cause wave cancellation between the first two electrodes, and the second two electrodes having a center-to-center spacing of $\lambda/4$ to cause wave cancellation between the second two electrodes, so as to create an electrode structure with constant velocity and no reflections.

The invention also relates to a withdrawal weighted electrode structure for a surface acoustic wave device having constant velocity and a predetermined reflection coefficient, K, for use in a surface acoustic wave device, the structure comprising a piezo-electric substrate having the electrode structures thereon with a center-to-center spacing of $\lambda/2$, first alternate ones of a first continuous portion of the electrodes having a common width ranging from $\lambda/4$ to $3\lambda/8$ in each wavelength, $\lambda$, and second alternate ones of the first continuous portion of the electrodes in each wavelength, $\lambda$, having a common width ranging from $\lambda/4$ to $\lambda/8$ in inverse relation to the first alternate electrode width such that the total reflection, K, from all of the electrodes in the continuous portion varies from K=maximum when all electrodes have widths of $\lambda/4$ to K=$\sqrt{2}/2$ at electrode widths of the first and second alternate electrodes, respectively, of $3\lambda/8$ and $\lambda/8$, so as to form an electrode structure having a predetermined reflection coefficient, K, depending upon the width of the first and second alternate electrodes.

BRIEF DESCRIPTION OF THE DRAWINGS

These and other objects of the present invention will be more fully understood in conjunction with the accompanying drawings in which like numbers indicate like components and in which:

FIG. 1 is a diagrammatic representation of a prior art resonator;

FIG. 2 is a diagrammatic representation of a prior art coupled resonator;

FIG. 3 is a schematic cross-sectional representation of a portion of an electrode structure in which, in a $2\lambda$ wavelength distance, four electrodes are used with the first two electrodes having a width of $\frac{3}{8}\lambda$ and the second two electrodes having a width of $\lambda/8$ to provide a structure with no reflections and constant velocity through the structure;

FIGS. 4A, 4B and 4C are graphs illustrating the representation of reflectivity of a prior art electrode structure utilizing $\lambda/4$ electrodes, illustrating in dashed lines an example of a desired reflectivity obtained by tapering the grating with withdrawal weighting, and illustrating the reflectivity of a single electrode;

FIG. 5 is a schematic representation of a prior art resonator in which the external gratings have been withdrawal weighted to obtain a weighted reflectivity; and FIGS. 6A and 6B are schematic representation of a $2\lambda$ section of electrodes wherein quarter wavelength electrodes and spaces of the prior art are compared to a $2\lambda$ distance of the electrodes of the present invention providing predetermined reflectivity and illustrating the first electrode in each wavelength having a width of $\frac{3}{8}\lambda$ and the second electrode having a width of $\lambda/8$ and the first and second electrodes having a center-to-center spacing of $\lambda/2$.

DETAILED DESCRIPTION OF THE DRAWINGS

FIG. 1 is a diagrammatic representation of a prior art resonator 10 illustrating the two transducers 12 and 14 separating external reflective gratings 16 and 18. A cavity or free space area 19 separates the two transducers and 14. In FIG. 1, if the two transducers 12 and 14 could be placed in abutting relationship with each other, there would be a constant velocity throughout the structure, which is desirable. However, when the transducers 12 and 14 are placed in abutting relationship or near each other, then electromagnetic cross-talk exists because the transducers 12 and 14 are very capacitive. Thus, they have to be separated or isolated from each other electrically. When that occurs, the unmetallized region 19 is formed in the center of the device. The region 19 will not have the same velocity as the partially metallized surfaces where the transducers 12 and 14 and the gratings 16 and 18 are located. The change in velocity means that the resonant frequency of the cavity 18 does not coincide with the resonant frequency of the gratings and transducers, so an increased insertion loss and distortion of the phase response is created. In order to compensate for the difference in velocity, it is necessary to change the separation distance 19 so it is not a multiple of $\lambda/4$. This, however, requires a knowledge of exactly how much the velocity has changed by having the region 19 unmetallized. The structure is no longer periodic and the change in cavity length may be compensated by proper adjustment of the length of the cavity by proper positioning of the electrodes. However, such technique is very complicated and imprecise and depends upon metal thickness and knowing how far to move the electrodes.

Another way to compensate for the change in velocity caused by the free space region 19 is to place a grating in cavity 19 to create a constant velocity in the region. However, a $\lambda/4$ grating has strong reflectivity and thus has to be designed to operate at a different frequency than the reflective gratings 16 and 18. Thus, it is designed to be, for example, higher or lower in frequency by some value such as 20% to minimize distortions caused by reflections from the grating. However, the structure is then no longer on a fixed grid and still has some reflectivity. If the frequency is changed too much, the velocity is no longer constant.

The same problem occurs with a prior art coupled resonator, as illustrated in FIG. 2. In a coupled resonator, the ideal center grating 20 is placed in the free space region between transducers 12 and 14. The purpose of the center grating 20 between transducers 12 and 14 is to keep the transducers 12 and 14 electrically separated from each other and yet have a constant acoustic velocity in the region between the transducers 12 and 14 with no reflections.

Further, in both the resonator of FIG. 1 and the coupled resonator of FIG. 2, it may be desirable to taper the reflectivity of the external gratings 16 and 18 to reduce side lobe amplitude and phase distortion. In the prior art this is done by weighted withdrawal of the electrodes. Thus, some of the electrodes are actually physically omitted from their normal positions on the substrate. However, as soon as the electrodes are omitted, and free spaces are created on the substrate, the velocity of the acoustic signal through the grating is changed. To know how to compensate by spacing the electrodes is very difficult because of the velocity changes with the thickness, type, width and placement of the electrodes. To place the electrodes properly, one must know how the velocity is affected by the metal electrodes and how the velocity changes with metal thickness. It has to be measured experimentally and it is not an accurate procedure. Further, once the calculations are made and a production mask is designed for a fixed metal thickness, if the metal thickness is changed or a different metal is used, then the entire mask needs redesigning for optimum performance.

The present invention overcomes these disadvantages of the prior art by providing electrode structures that either have a reflection coefficient K = zero or K is a predetermined amount and yet the velocity throughout the structure is held constant. The invention provides the ability to either specifically reduce or completely eliminate reflections while maintaining constant velocity through the electrode structure.

A $2\lambda$ length of electrode structure of the present invention is illustrated in FIG. 3. In this structure, the reflectivity is totally eliminated while holding the velocity constant; thus the reflection coefficient, K, is zero. In the typical two electrode per wavelength structure normally used in resonator transducers and gratings, there is a particular velocity because the metallization of the substrate is 50/50 and the electrode edges are eight edges per $2\lambda$ distance. In the structure illustrated in FIG. 3, these characteristics have not changed. The metallization still covers one-half of the structure area and free space occupies the other half. There are still four electrodes with eight edges in the $2\lambda$ distance. Thus, velocity has not changed and is constant throughout the structure. However, the first two electrodes have a width of $\frac{3}{8}\lambda$ separated by a free space of $\frac{3}{8}\lambda$. Thus, the center-to-center distance of the first two electrodes 22 and 24 is $6/8\lambda$. An acoustic wave traveling from the first electrode 22 to the second electrode 24 and being reflected will travel a total distance of $2 \times 6/8\lambda$ or $12/8\lambda$ or $1\frac{1}{2}\lambda$. This means that the reflected wave arrives at its origin 180 out of phase with the transduced wave thus cancelling it. In like manner, the second two electrodes 26 and 28 have a width of $\lambda/8$ and are separated by a free space of $\lambda/8$. Thus, a transduced wave originating at electrode 26 and traveling to electrode 28 and reflecting to its origin travels a distance of $2 \times \lambda/4$ or $\lambda/2$. Again, this is one-half of a cycle and the reflected wave is out of phase with the transduced wave and cancels it. Thus, the structure in FIG. 3 has a reflection coefficient, K=0, and entirely cancels any reflection and yet has the same velocity as a two electrode per wavelength transducer because it has equal metallization ratio with the free surface area and the same number of electrode edges which store energy. Such a structure can be continued indefinitely during the length of the entire grating or transducer and cause the entire structure to be nonreflective if desired or can be used in withdrawal weighting methods by selectively turning some of the electrode reflections to zero and thus effectively removing them from the electrode structure as far as reflections are concerned, even though they are physically left in the structure to maintain a constant velocity through the structure. Not only is this easy to accomplish physically and will allow any predetermined variation in reflectivity as desired, but provides results comparable to withdrawal weighting. It also allows a mask to be constructed utilizing an E-beam technique, well known in the art, since all of the electrodes lie on fixed grid positions, thus allowing the beam to be digitally stepped from one location to another in forming the electrodes. In the prior art, this is not possible because the spacing when adjusted by withdrawal weighting becomes irregular and at intervals which are not multiples of $\lambda/8$.

Thus, the structure illustrated in FIG. 3 has several advantages. It can, for instance, be used for a center grating in the resonator of FIG. 1 or the resonator of FIG. 2 where a constant velocity is required in the free space 18 and yet no reflections are wanted. Further, in the coupled resonator of FIG. 2, it is important to have transducers 12 and 14 that have no reflections. Such transducers and gratings can be formed according to the diagram illustrated in FIG. 3 and the desired achievements are attained.

FIG. 4A illustrates an electrode structure 30 having electrodes and spacing of uniform width. Curve 32 in FIG. 4B is a plot of the uniform reflectivity for the group of electrodes 30 illustrated in FIG. 4A. FIG. 4C illustrates the reflectivity of a single electrode. It will be noted in FIG. 4C that the wave form 33 representing the reflectivity of a single electrode is sinusoidal. At an angle of 90° or $\lambda/4$, as illustrated by point 34, the reflectivity of the electrode is at a maximum. At $\lambda/8$ or 45° the reflectivity is at a reduced value of 0.707 or $\sqrt{2}/2$. In like manner, at $\frac{3}{8}\lambda$ or 135°, reflectivity has again been reduced to 0.707 or $\sqrt{2}/2$. Thus, FIG. 4C illustrates that if the individual electrode widths are changed to $\lambda/8$, the reflectivity decreases from the maximum value obtained when the electrode is $\lambda/4$ in width. In like manner, if the electrode is increased in size to $\frac{3}{8}\lambda$, the reflectivity of the electrode again decreases to 0.707.

It may be desirable, as stated earlier, to adjust the reflection of the external gratings through withdrawal weighting to obtain a reflectivity that tapers rather than having the constant value illustrated in FIG. 4B by wave form 32. Shown in FIG. 4B by dashed line 36 is a wave form which is a tapering wave form of a reflectivity of the grating structure 30 that may be desirable and obtained by withdrawal weighting. Other tapering values may be desired for different circumstances and the one illustrated in FIG. 4B is for purposes of illustration only.

To obtain a wave form such as that illustrated by wave form 36 in FIG. 4B with the prior art, a resonator illustrated in FIG. 5 may have the external gratings 16 and 18 adjusted to have electrodes missing at predetermined locations 15 throughout the length thereof to cause a desired reflective pattern. Withdrawal weighting, if properly accomplished, achieves uniform bandwidth for the structure. The problem, however, as stated earlier, is to determine where to place the remaining electrodes when certain electrodes have been omitted because the velocity in the free space areas changes. It is very difficult to calculate such electrode placements as is illustrated in the article by Tanski, entitled *SAW Resonators Utilizing Withdrawal Weighted Reflectors, IEEE Transactions on Sonics and Ultrasonics*, Vol. SU-26, No. 6, Nov. 1979, pp. 404 et. seq.

The novel electrode structure having K=0, or no reflections, as illustrated in FIG. 3, can be used advantageously in the resonator structure of FIG. 5 because the electrodes are effectively removed from the transducer insofar as reflectivity is concerned through reducing their reflectivity to zero. At the same time, however, a constant velocity is maintained through the grating because the electrodes are physically present. Further, if it is desired to actually change reflectivity to some degree over the entire electrode structure, a grating design as shown in FIG. 6B can be combined with FIG. 3 to give any desired tapered reflectivity of the external gratings without changing velocity.

FIG. 6A illustrates a typical uniformly spaced $\lambda/4$ electrode structure. It will be noted that each electrode has an identical width of $\lambda/4$ and is separated from its neighbor by a width of $\lambda/4$. With this type of electrode structure, the reflectivity is at a maximum, as shown at point 34 in FIG. 4C. However, if a first one of the electrodes is made to have an increase in width while the alternate one is made to have a corresponding decrease in width, the result is to lower the reflectivity without changing the velocity. As can be seen in FIG. 6B, four electrodes 38, 40, 42 and 44 are located in a $2\lambda$ distance with two consecutive electrodes 38, 40 and 42, 44 each occurring in a single wavelength, $\lambda$. It will be noted, of course, that the number of electrodes and thus the number of edges has not changed from that in FIG. 6A. In like manner, the metal-to-free space utilization ratio has not changed. In FIG. 6A, the first two electrodes 46 and 48 cover one-half of a wavelength while the spaces 50 and 52 also cover one-half of a wavelength. In FIG. 6B, the two electrodes 38 and 40 together cover one-half wavelength while the two spaces 54 and 56 jointly cover one-half wavelength. Thus, the velocity of the structure in FIG. 6B has not changed from the structure in FIG. 6A. However, because electrode 38 has a width of $\frac{3}{8}\lambda$, it now has a reflectivity of 0.707 or $\sqrt{2}/2$ as shown at point 58 in FIG. 4C. In like manner, the electrode 40 has its width reduced to $\lambda/8$ and now has a reflectivity as indicated in FIG. 4C at point 60 of 0.707 or $\sqrt{2}/2$. Thus, the total reflectivity of the structure shown in FIG. 6A is at a maximum while the reflectivity of the structure in FIG. 6B has been reduced to 0.707 of the maximum, but the velocity has not been changed.

Clearly, the reflectivity can be predetermined at any value between maximum and 0.707 of maximum by adjusting the two electrode widths in the range from $\lambda/4$ to can be seen from FIG. 4C, the reflectivity could be adjusted below 0.707 by causing electrode widths less than $\lambda/8$ and more than $3\lambda/8$. However, other considerations must then be taken into account.

Thus, by combining the electrode structures in FIG. 3 and in FIG. 6B, a reflective grating can be withdrawal weighted and tailored to any particular reflective curve simply by using any desired combination of the structures in FIG. 3 and FIG. 6B. The FIG. 3 structure will have no reflectivity but constant velocity, while the structure in FIG. 6B will have constant velocity and can be tailored to any desired reflectivity between the maximum at point 34 in FIG. 4C and $\sqrt{2}/2$, or $\lambda/8$ and $3\lambda/8$ electrodes to give any response that the designer wishes. As stated previously, by continuing to decrease the width of the smaller electrode 40 beyond $\lambda/8$ and correspondingly increasing in width the larger $\frac{3}{8}$ electrode 38, the resulting reflectivity would continue to move further down on the curve 32 shown in FIG. 4C. However, complications arise if electrode widths are used below $\lambda/8$.

One of the advantages of using the circuit of FIG. 3 to give a reflection coefficient of K=0 is that the transducer electrodes are allowed to be placed on the peak of the standing waves for maximum coupling. Generally, because the transducer electrodes have reflectivity, the electrodes are placed off the center of the standing wave peaks to reduce distortion of the response. With the present invention, the electrodes can be placed on the peak of the standing wave for maximum coupling because they have no reflections. Thus, the structure achieves the same result as split-finger electrodes without the requirement of changing the length of the cavity.

The present invention enables the construction of electrode structures which have either zero reflectivity or a predetermined variable reflectivity between a maximum and a desired minimum while maintaining velocity constant. These features allow a great many advantages in the construction of resonators and coupled resonators. Transducers can be made for resonators which have zero reflectivity and center gratings can then be placed on the peaks of the standing waves for maximum coupling. External gratings can be easily tailored to produce any desired tapered reflectivity for the purpose of reducing side lobes and phase distortion. Further, the electrode pattern does not vary with a change in metallization or metal thickness. Also, an E-beam technique can be used to form production masks.

While the invention has been described in connection with a preferred embodiment, it is not intended to limit the scope of the invention to the particular form set forth, but, on the contrary, it is intended to cover such alternatives, modifications and equivalents as may be included in the spirit and scope of the invention as defined by the appended claims.

I claim:

1. An electrode structure for use in transducers and gratings in a surface acoustic wave device, said structure having no reflections and having the velocity of a uniform two electrode per wavelength structure and comprising:
   a piezo-electric substrate;
   only four spaced electrodes on said substrate for each $2\lambda$ distance of electrode structure;
   the first two electrodes having identical widths and a center-to-center spacing of $3\lambda/4$ to cause wave cancellation between the first two electrodes; and
   the second two electrodes having identical widths and a center-to-center spacing of $\lambda/4$ to cause wave cancellation between the second two electrodes so as to create an electrode structure having the velocity of a uniform two electrode per wave length structure and no reflections.

2. An electrode structure as in claim 1 wherein:
   the width of each of the first two electrodes is $3\lambda/8$; and
   the width of each of the second two electrodes is $\lambda/8$.

3. An electrode structure as in claim 2 wherein the space between the first two electrodes is $3\lambda/8$, the space between the first two electrodes and the second two electrodes is $\lambda/4$; and the space between the second two electrodes is $\lambda/8$.

4. An electrode structure as in claim 3 wherein said structure is a reflector grating.

5. An electrode structure as in claim 3 wherein said structure is a transducer with interdigitated electrodes.

6. A withdrawal weighted electrode structure for a surface acoustic wave device, said electrode structure having the velocity of a uniform two electrode per wavelength structure and a predetermined reflection coefficient, K, said structure comprising:
   a piezo-electric substrate having multiple electrodes thereon with center-to-center spacing of $\lambda/2$;
   first alternate ones of at least a first continuous portion of said electrodes having a common width ranging from greater than $\lambda/4$ to a maximum of $3\lambda/8$ over each selected wavelength, $2\lambda$; and
   second alternate ones of said at least a first continuous portion of said electrodes over each selected wavelength, $2\lambda$, having a common width ranging from less than $\lambda/4$ to a minimum of $\lambda/8$ in inverse relation to said first alternate electrode width such that the total reflection, K, from all of said electrodes in each selected wavelength, $2\lambda$, varies from a value K=approaching a maximum when all electrodes have widths approaching $\lambda/4$ to a value $K=\sqrt{2}/2$ at electrode widths of said first and second alternate electrodes, respectively, of $3\lambda/8$ and $\lambda/8$ so as to form an electrode structure having a predetermined reflection coefficient, K, and the constant velocity of a uniform two electrode per wavelength structure.

7. An electrode structure as in claim 6 wherein said structure is a reflector grating.

8. An electrode structure as in claim 6 wherein said structure is a transducer with interdigitated electrodes.

9. An electrode structure as in claim 6 further comprising:
   at least a second continuous portion of said electrodes;
   the first two electrodes of each $2\lambda$ wavelength of said second continuous portion of said electrodes having identical widths and a center-to-center spacing of $3\lambda/4$ to cause wave cancellation between said first two electrodes; and
   the second two electrodes of each $2\lambda$ wavelength of the second continuous portion of the electrodes having identical widths and a center-to-center spacing of $\lambda/4$ to cause wave cancellation between the second two electrodes thereby creating a withdrawal weighted electrode structure with at least the first continuous electrode portion having a predetermined reflection coefficient, K, and at least the second continuous portion having a reflection coefficient, K=0.

10. An electrode structure as in claim 9 wherein the structure is a grating.

11. An electrode structure as in claim 9 wherein the structure is a transducer.

12. A resonator having external gratings separated by spaced transducers with the gratings and the transducers having only two electrodes per wavelength, $\lambda$, and the same velocity, said gratings having a predetermined reflection coefficient, K, said resonator comprising:
    a piezo-electric substrate;
    first and second spaced gratings attached to said substrate; and
    input and output spaced transducer structures attached to said substrate between said first and second gratings for generating standing waves in said substrate;
    each of said first and second gratings having at least a first continuous electrode portion having electrodes with a center-to-center spacing of $\lambda/2$ and having first alternate ones of said electrodes with a common width ranging from greater than $\lambda/4$ to a maximum of $3\lambda/8$ over each selected wavelength, $2\lambda$, of said first electrode portion and second alternate ones of said electrodes over each selected wavelength, $2\lambda$, of said first electrode portion, said second alternate electrode having a common width ranging from less than $\lambda/4$ to a minimum of $\lambda/8$ in inverse relation to said first alternate electrode widths such that the total reflection, K, from all of said electrodes in each selected wavelength, $2\lambda$, of said first continuous electrode portion varies from K=approaching a maximum when all electrodes have widths approaching $\lambda/4$ to $K=\sqrt{2}/2$ electrode widths of said first and second alternate electrodes, respectively, of $3\lambda/8$ and $\lambda/8$.

13. A resonator as in claim 12 wherein said resonator has a middle grating to form a coupled resonator.

14. A resonator as in claim 13 wherein said middle grating has a velocity identical to the velocity of the transducers and the external gratings and has no reflections.

15. A resonator as in claim 12 wherein said middle grating comprises an electrode structure having a velocity common to the transducers and the external gratings, but has a variable reflectivity from a maximum to $\sqrt{2}/2$ times the maximum reflectivity.

16. A coupled resonator having external gratings separated by spaced transducers and having a center grating, all of which have only two electrodes per wavelength, $\lambda$, and all of which have the same velocity, said center grating having a reflection coefficient, K, of zero, said coupled resonator comprising:
    a piezo-electric substrate;
    first and second spaced gratings attached to said substrate;

input and output spaced transducer structures attached to said substrate between said first and second gratings for generating standing waves in said substrate;

a center grating located between said input and output transducer structures to couple said transducer structures acoustically;

two electrodes of each $2\lambda$ wavelength of said center grating having identical widths and a center-to-center spacing of $3\lambda/4$ to cause wave cancellation between said first two electrodes; and the second two electrodes of each $2\lambda$ wavelength of said center grating having identical widths and a center-to-center spacing of $\lambda/4$ to cause wave cancellation between said second two electrodes so as to create a center grating structure having the same velocity as the transducers and external gratings and having no reflections.

17. A method of forming an electrode structure for use in transducers and gratings in a surface acoustic wave device, said structure having no reflections and a velocity that is constant, said method comprising the steps of forming only four spaced electrodes on a piezo-electric substrate for each $2\lambda$ distance of structure;

forming the first two electrodes with identical widths and a center-to-center spacing of $3\lambda/4$ to cause wave cancellation between the first two electrodes; and forming the second two electrodes with identical widths and a center-to-center spacing $\lambda/4$ to cause wave cancellation between the second two electrodes so as to create an electrode structure with constant velocity and no reflections.

18. A method as in claim 17 wherein said electrodes are formed with a mask that is created with an E-beam structure that is digitally operated.

19. A method of forming a withdrawal weighted electrode structure for a surface acoustic wave device having multiple electrodes with only two electrodes per wavelength, $\lambda$, with a constant velocity and a predetermined reflection coefficient, K, said method comprising the steps of:

forming first alternate ones of said electrodes with a common width ranging from $\lambda/4$ to $3\lambda/8$; and forming second alternate ones of said electrodes with a common width ranging from $\lambda/4$ to $\lambda/8$ in inverse relation to the first alternate electrodes widths such that the total reflection, K, from all of said electrodes in each wavelength, $\lambda$, varies from K=maximum when all electrodes have widths of $\lambda/4$ to K=when the electrode widths of said first and second alternate electrodes, respectively, are of $3\lambda/8$ and $\lambda/8$ so as to form an electrode structure having a predetermined reflection coefficient, K.

20. A method as in claim 19 wherein said withdrawal weighted electrode structure is formed with electrodes as a uniform grid.

21. In a resonator structure having external gratings with $\lambda/4$ electrodes and separated by spaced transducers and having a constant velocity through said structure, the improvement comprising:

middle grating means between said transducers and having multiple electrodes with widths and a predetermined spacing to provide a reflection coefficient of 0 and a constant velocity that is essentially the same as the velocity of the remainder of the structure.

22. In a resonator structure having external gratings with $\lambda/4$ electrodes and separated by spaced transducers and having a constant velocity throughout the structure, the improvement comprising:

a middle grating having a predetermined reflectivity in the range between and less than a maximum and a constant velocity that is essentially the same as the velocity of the remainder of the structure.

23. In a resonator structure having spaced external gratings with $\lambda/4$ electrodes and a constant velocity through said gratings, the improvement comprising:

spaced transducer means separating said gratings, each of said transducer means having multiple electrodes with widths and a predetermined spacing to provide a reflection coefficient of 0 and a constant velocity that is essentially the same as the velocity through the gratings.

24. In a resonator structure having external gratings with $\lambda/4$ electrodes and a constant velocity through said gratings, the improvement comprising:

spaced transducers separating said gratings; each of said transducers having multiple electrodes with a predetermined reflectivity in the range between 0 and less than a maximum and a constant velocity that is essentially the same as the velocity of the remainder of the structure.

* * * * *